United States Patent [19]
Juengling

[11] Patent Number: 5,679,600
[45] Date of Patent: Oct. 21, 1997

[54] DOUBLE LOCOS FOR SUBMICRON ISOLATION

[75] Inventor: Werner Juengling, Boise, Id.

[73] Assignee: Micron Technology, Inc., Boise, Id.

[21] Appl. No.: 540,797

[22] Filed: Oct. 11, 1995

[51] Int. Cl.$^6$ .................................................. H01L 21/76
[52] U.S. Cl. ................................................ 437/69
[58] Field of Search .............. 437/69, 70; 148/DIG. 85, 148/DIG. 86, DIG. 117

[56] References Cited

U.S. PATENT DOCUMENTS 5,468,675  11/1995  Kaigawa ................................. 437/69
5,567,645  10/1996  Ahn et al. .

FOREIGN PATENT DOCUMENTS

59-27543   2/1984  Japan .
63-136548  6/1988  Japan .
130245     2/1989  Japan .

Primary Examiner—George Fourson
Attorney, Agent, or Firm—Workman, Nydegger & Seeley

[57] ABSTRACT

An improved LOCOS process is provided particularly for use with submicron isolation dimensions in the form of a double LOCOS process, in which double LOCOS stacks are formed upon a silicon substrate including a thin first oxide (pad oxide) layer, a thin first nitride layer, a second oxide layer and a thick second nitride layer. The stacks are optionally laterally enclosed in polysilicon spacers. A first field oxidation is then performed to grow oxide up to just below the thickness level at which defect formation commences, and sufficiently thick for the field oxide to form a continuous oxide layer with the second oxide layer. The thick second nitride layer is then removed from the stacks, and a second field oxidation is performed to reach the final field oxide thickness.

19 Claims, 7 Drawing Sheets

DOUBLE LOCOS FOR SUBMICRON ISOLATION

BACKGROUND OF THE INVENTION

1. The Field of the Invention

The present invention relates to the manufacture of semiconductor devices. More particularly, the present invention is directed to novel processes for forming submicron LOCOS isolation regions upon a substrate.

2. The Relevant Technology

Many forms of semiconductor processing employ local oxidation of silicon (LOCOS) to form isolation regions in integrated circuits. The isolation regions, known as field oxide, separate active regions of the integrated circuit in which circuit devices are formed.

In conventional processing, a thin pad oxide layer is grown upon a silicon substrate. A relatively thick silicon nitride layer is then deposited over the pad oxide layer. Photolithography techniques are then employed to remove the nitride layer and the pad oxide layer over the areas in which the isolation regions are to be formed. The exposed silicon is then oxidized to form the isolation regions.

As feature sizes decrease to micron and submicron levels, difficulties with conventional LOCOS processing arise. The pad oxide layer provides a lateral path for oxidants during the growth of field oxide, resulting in lateral growth of the field oxide known as "bird's beak". Bird's beak increases the effective size of the isolation area at the cost of the active area. The fractional loss of active area due to encroachment by bird's beak increases as the isolation dimensions are reduced. As isolation spacing is reduced below one micron, LOCOS thickness tends to decrease sharply. The extent of bird's beak, however, tends to be independent of isolation dimensions. Bird's beak thus becomes a significant problem as isolation dimensions are reduced.

Bird's beak can be substantially reduced by SILOS, sealed interface local oxidation. In SILOS, a nitride layer is grown or deposited in direct contact with the silicon substrate. With elimination of oxide between the nitride film and the silicon, lateral oxidation during the local oxidation is inhibited.

The SILOS process has its own inherent difficulties. Silicon nitride exhibits high tensile stress which can cause stress-induced defects along the periphery of the local oxide during the high temperatures of oxidation processing. The stress-induced defects can cause junction leakage, and consequent device and circuit failure. Relieving this stress is the very purpose of the pad oxide layer included in conventional processing.

Bird's beak can also be reduced by increasing the thickness of the nitride layer. As bird's beak grows, the edges of the nitride layer must be displaced upward away from the substrate. A thicker nitride layer is stiffer and thus resists the growth of bird's beak.

But thicker nitride layers also increase the potential for stress-induced defects, particularly as thickness of the field oxide increases. And while increasing the thickness of the pad oxide layer can help relieve this stress, thicker pad oxide also increases the growth of bird's beak. Thus in conventional processing, the pad oxide and nitride thicknesses together with the thickness of the local oxide must be carefully optimized to minimize the extent of bird's beak without generating dislocation defects and to still achieve a sufficiently thick field oxide. Submicron isolation spacing severely strains the capability of conventional processing to simultaneously optimize these factors. Yet submicron spacing is required to increase circuit density and speed, and to increase the scale of integration. Thus an improved LOCOS process is needed.

SUMMARY AND OBJECTS OF THE INVENTION

An object of the present invention is to provide a LOCOS process useful with submicron isolation spacing.

Another object of the present invention is to provide a LOCOS process combining small bird's beak encroachment with low stress processing.

Another object of the present invention is to provide a LOCOS process combining small bird's beak encroachment with low stress processing while achieving relatively thick local oxide.

Another object of the present invention is to provide a LOCOS process useful with submicron isolation dimensions combining small bird's beak encroachment with low stress processing while achieving relatively thick local oxide.

In accordance with the present invention, an improved LOCOS process is provided in the form of a double LOCOS process in which double LOCOS stacks are formed upon a silicon substrate including a thin first oxide (pad oxide) layer, a thin first nitride layer, a second oxide layer and a thick second nitride layer. The stacks are optionally laterally enclosed in polysilicon spacers. A first field oxidation is then performed to grow oxide up to just below the thickness level at which defect formation commences, and sufficiently thick for the field oxide to form a continuous oxide layer with the second oxide layer. The thick second nitride layer is then removed from the stacks, and a second field oxidation is performed to reach the final field oxide thickness. During the second field oxidation, the thin first nitride layer deflects upward at its edges, relieving the stress which would otherwise cause defects.

In order to accomplish the foregoing, the present inventive process takes advantage of this aspect of the field oxide growth process by growing a LOCOS isolation region in two oxidation steps. The first oxidation step is performed with a thick nitride layer present in the LOCOS stack to prevent bird's beak formation. The second oxidation step is performed with only a thin, relatively easily deflectable nitride layer present in the LOCOS stack, so that stress buildup may be relieved during the second oxidation step and moderate bird's beak growth may occur.

The two different stack compositions for the two field oxidation steps are provided through the use of an initial double or four-layer LOCOS stack, a portion of which is removed to create the second stack composition.

To create the initial double LOCOS stack, a thin first oxide (pad oxide) layer is grown and covered with a thin first nitride layer. Upon the thin nitride layer is deposited a second oxide layer, which in turn is covered with a thick second nitride layer. The active areas are then defined by photolithography and etched to, or into, the silicon substrate, leaving the initial four-layer LOCOS stacks.

The first field oxidation step is then performed. The thick second nitride layer substantially prevents formation of bird's beak.

After the first field oxidation step, the thick second nitride layer is removed from the LOCOS stack. This leaves only the first thin nitride layer present in the stack during the second field oxidation. The more flexible first nitride layer prevents excessive stress buildup as the field oxide thickness increases in the second field oxidation step, and allows a controlled and desirable amount of bird's beak formation.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

It has been found that stress-caused defects are created near the end of the field oxide growth process during the growth of relatively thick field oxide isolation regions. It has also been found that if the oxide growth is stopped before reaching certain thickness levels, defect formation is avoided. While the exact thickness will vary somewhat with the specifications of a particular LOCOS process, it has been found that 1500 to 2000 Angstroms of oxide can be grown, even with sufficient nitride thickness to substantially prevent bird's beak formation, without significant defect formation. The foregoing may be accomplished by the inventive process, preferred embodiments of which are set forth below.

Figure 1:
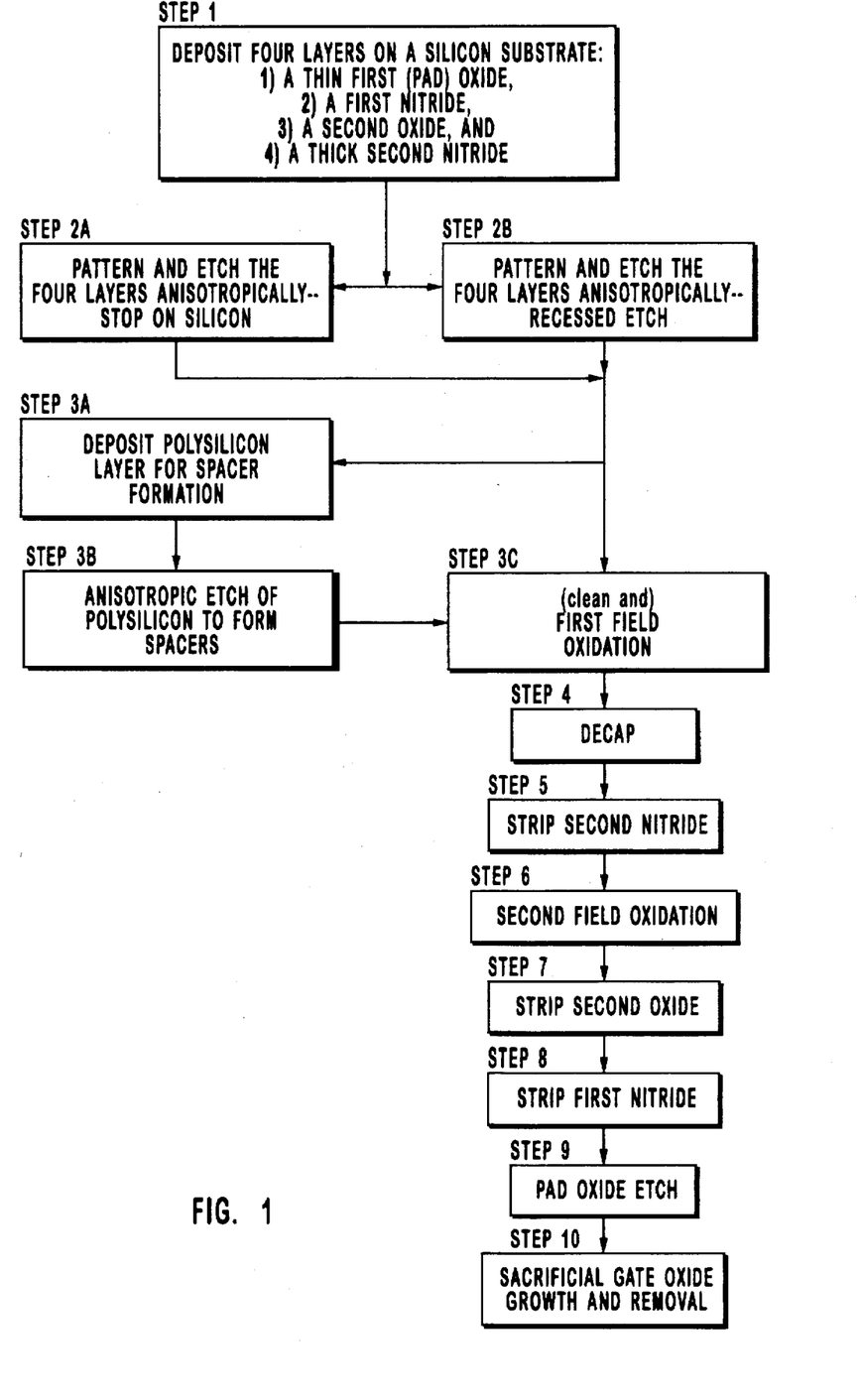
FIG. 1 is a process flow diagram showing the major steps of a currently preferred process flow according to the present invention.
Figure 2:
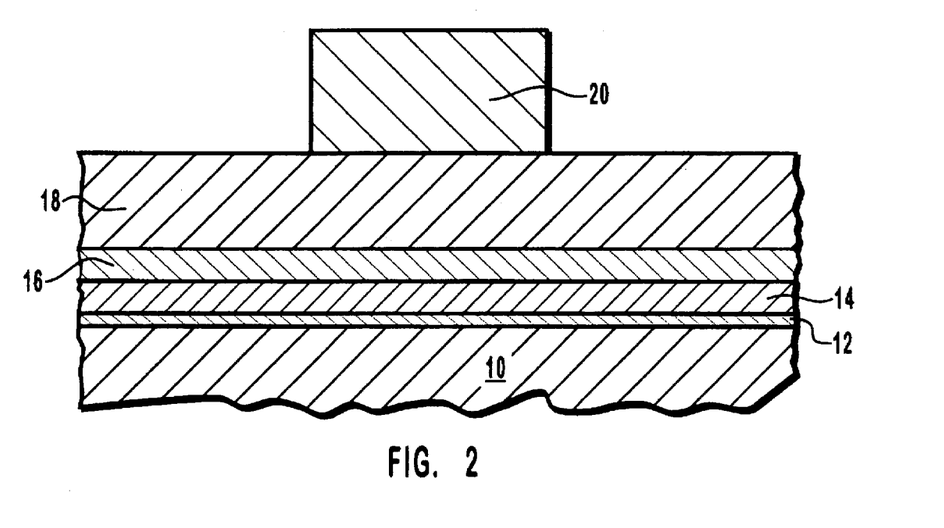
FIG. 2 is a partial cross section of a silicon substrate having provided thereon a LOCOS stack, including a thin first oxide layer, a first nitride layer, a second oxide layer, and a second nitride layer, for the practice of the present invention.

As shown in detail by the process flow diagram of FIG. 1, Step 1 deposits four layers on a silicon substrate: (1) a thin first oxide layer, (2) a first nitride layer, (3) a second oxide layer (which may be a TEOS layer or any other suitable layer), and (4) a second thick nitride layer. A cross section of such a substrate is shown in FIG. 2 where silicon substrate 10 has been provided with a thin first oxide layer 12, a first nitride layer 14, a second oxide layer 16, and a thick second nitride layer 18.

First nitride layer 14 will preferably be between about 1000 Angstroms and 1500 Angstroms. Second nitride layer 18 will preferably be between about 1500 Angstroms and 2000 Angstroms.

First oxide layer 12 will preferably be a thermal oxide grown to between about 50 Angstroms and 100 Angstroms, and will most preferably be about 80 Angstroms. Second oxide layer 16 will preferably be a deposited oxide with a thickness between about 200 Angstroms and 500 Angstroms, most preferably about 250 Angstroms. Typical second oxide layers will be TEOS or DCS based films.

As seen in Steps 2A and 2B of FIG. 1, photoresist is deposited on top of the four layers, exposed and developed. Patterned photoresist layer 20 in the cross section of FIG. 2 results. Steps 2A and 2B also specify that all four layers are etched away anisotropically. Alternatively, as seen in Step 2B, the etch may continue into the silicon substrate for a predetermined distance.

Figure 3A:
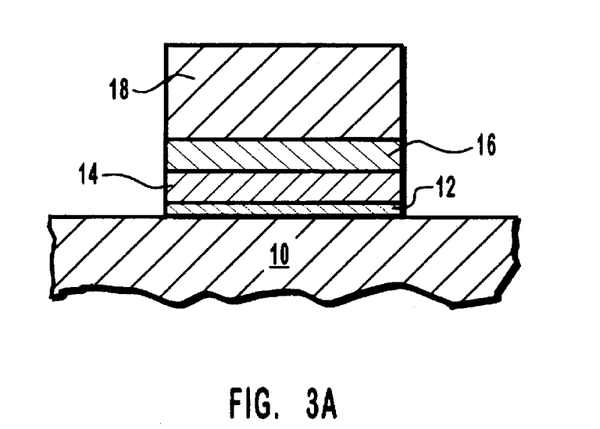
FIG. 3A is the cross section of FIG. 2 after an etch step has removed portions of the four layers down to the silicon substrate.

The result of etching the four layers to the silicon substrate is shown in FIG. 3A, wherein the regions of the four layers not shielded by photoresist have been removed, and the photoresist has been stripped from the illustrated LOCOS stack.

After the four layers have been patterned and etched, a first field oxidation is performed, as indicated in FIG. 1 by Step 3C. Alternatively, as shown in Step 3A, before the first field oxidation of Step 3C, a polysilicon spacer may be formed around the four layer stacks which define the isolation regions. The alternative process flow of Step 3A, a polysilicon deposition, is followed by Step 3B, which is an anisotropic etch of the deposited polysilicon. After Step 3B, Step 3C of FIG. 1 will be performed. The results of performing these optional Steps 3A, 3B are shown in FIG. 3B, in which polysilicon spacers 22 have been formed around the four layer LOCOS stack.

Figure 3B:
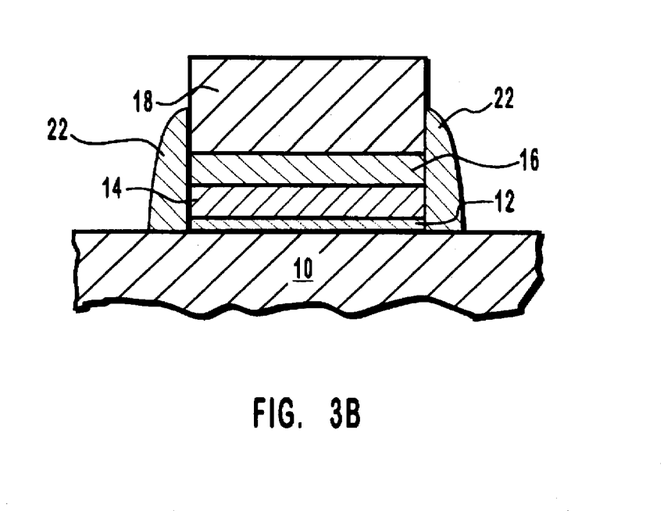
FIG. 3B is the cross section of FIG. 3A after deposition of a polysilicon layer thereover, followed by an anisotropic etch step that removes portions of the deposited polysilicon layer, leaving a polysilicon spacer remaining after the etch step.

Polysilicon spacers 22 shown in FIG. 3B have the potential to enhance the inventive process in at least three ways. First, a clean step (not shown) that may be required before first field oxidation Step 3C might etch or otherwise degrade second oxide layer 16 absent polysilicon spacers 22 to protect it. Second, during first field oxidation Step 3C, and during second field oxidation Step 6, to be discussed below, polysilicon spacers 22 are gradually oxidized to form part of the resulting field oxide. Bird's beak formation normally begins very soon in the oxidation process, but with polysilicon spacers 22 shown in FIG. 3B, bird's beak formation cannot begin until polysilicon spacers 22 have been oxidized through to first oxide layer 12. Polysilicon spacers 22 thus delay and consequently reduce bird's beak formation. Third, prior to the Step 5 strip of second nitride layer 18, to be discussed below, polysilicon spacers 22 assist in achieving a continuous oxide film coverage which protects first nitride layer 14 during the Step 5 strip of second nitride layer 18. The second and third advantages will be further discussed below in conjunction with the relevant processing steps.

During the first field oxidation of Step 3C, the oxide is grown as thick as possible without causing stress-related defects. From 1500 to 2000 Angstroms of oxide can be grown without significant defect formation.

Figure 4A:
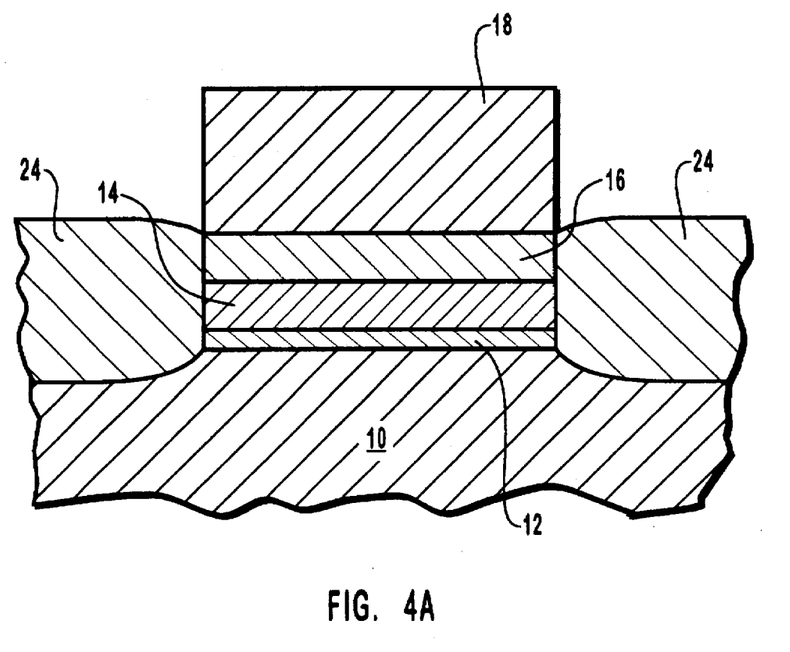
FIGS. 4A, 4B are, respectively, cross sections of FIGS. 3A, 3B after a first field oxidation.

If polysilicon spacers are not used, the first field oxidation of Step 3C must also produce sufficient oxide thickness such that the field oxide together with the second oxide layer forms one continuous oxide layer. This condition is shown in FIG. 4A. Field oxide 24 is sufficiently thick to reach the level of second oxide layer 16, so that field oxide 24 and second oxide layer 16 together form a continuous oxide layer, and first nitride layer 14 is physically encapsulated by field oxide 24 and second oxide layer 16. With the thick, relatively rigid second nitride layer 18 on top of the stack, bird's beak formation into first oxide layer 12 has been substantially prevented.

Figure 4B:
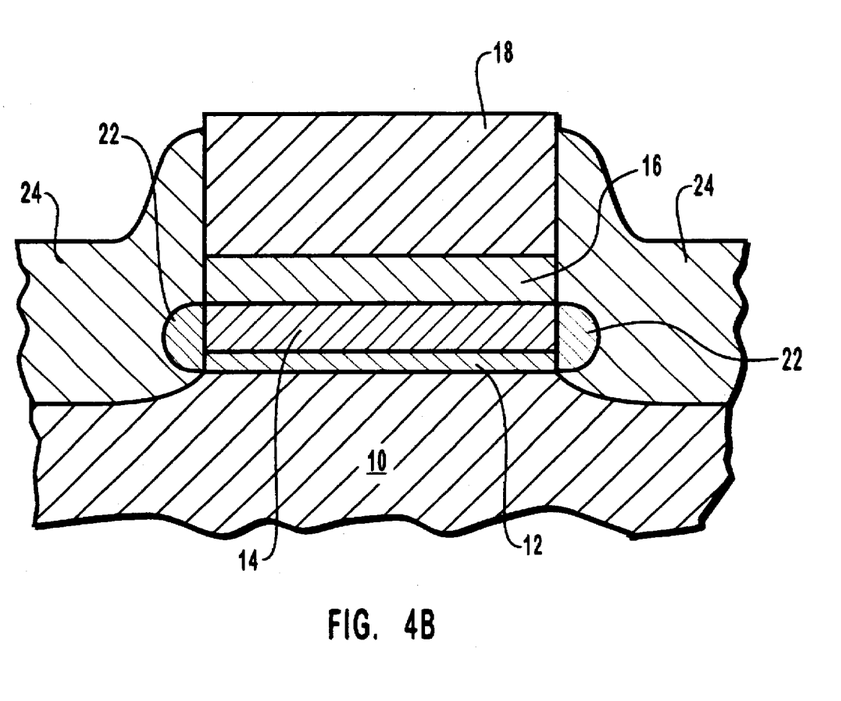

FIG. 4B shows the results of the first field oxidation of Step 3C when performed upon the stack with polysilicon spacers shown in FIG. 3B. Field oxide 24 is grown up higher around the sides of the stack. This gives a wider permissible thickness range of the field oxide after the first field oxidation in Step 3C, since the desired continuous oxide film may be produced with less average field oxide thickness. Polysilicon spacers 22 have been partially converted into oxide. Because polysilicon spacers 22 have not been oxidized all the way to the interface thereof with first oxide layer 12, bird's beak formation has been prevented. If the first field oxidation of Step 3C is sufficient to completely oxidize spacers 22, the presence of thick second nitride layer 18 functions to substantially prevent formation of bird's beak.

After the first field oxidation step of Step 3C, a decap Step 4 is performed as shown in FIG. 1. Decap Step 4 is a short oxide etch to remove the oxide from the top of second nitride layer 18. It may be performed by conventional processes.

Next, as shown in Step 5 of FIG. 1, second nitride layer 18 is stripped. Nitride layer 18 may be stripped by hot phosphoric acid ($H_3PO_4$) or other conventional oxide selective techniques.

Figure 5A:
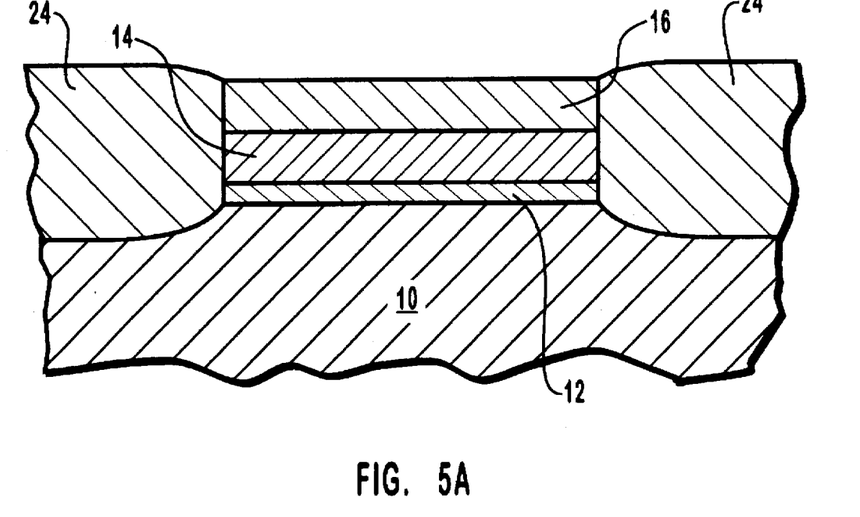
FIGS. 5A, 5B are, respectively, cross sections of FIGS. 4A, 4B after removal of the second nitride layer.
Figure 5B:
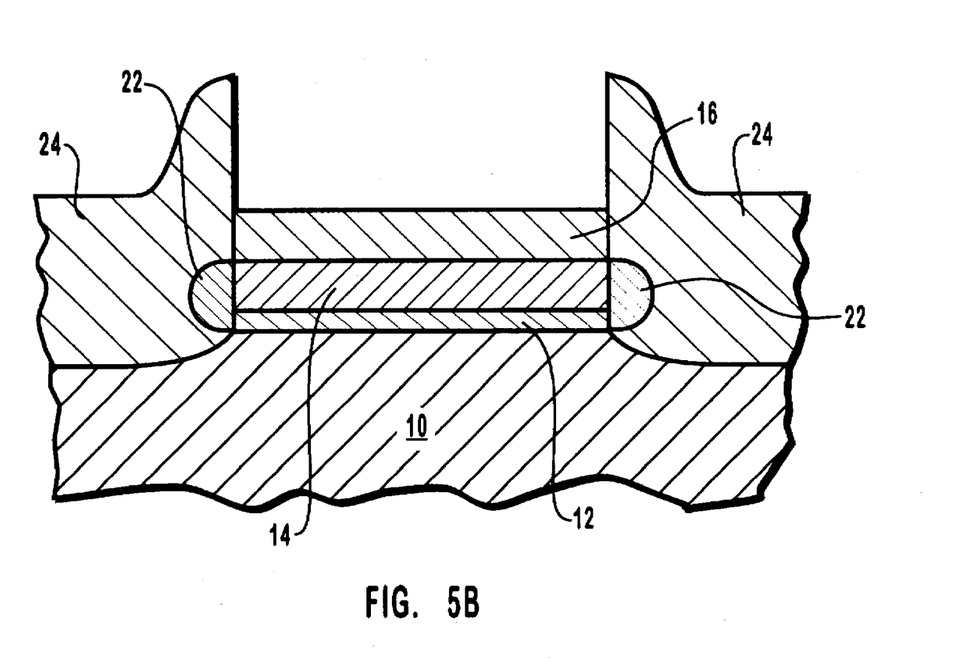

FIGS. 5A and 5B show the cross section of FIGS. 4A and 4B after decap and strip of second nitride layer 18. The continuous oxide layer formed by field oxide 24 and second oxide layer 16 protects first nitride layer 14 from the stripping agent.

After second nitride strip, as shown in Step 5 of FIG. 1, a second field oxidation is performed in Step 6. Second field oxidation Step 6 permits growth of the field oxide thickness beyond the point at which defects would begin to form in first field oxidation Step 3A. The formation of defects is prevented, however, because of the removal of second nitride layer 18. The remaining first nitride layer 14 is relatively thin and flexible, and thus deflects upward at the edges thereof, relieving stresses that could otherwise cause defects, and allowing some growth of bird's beak.

Figure 6A:
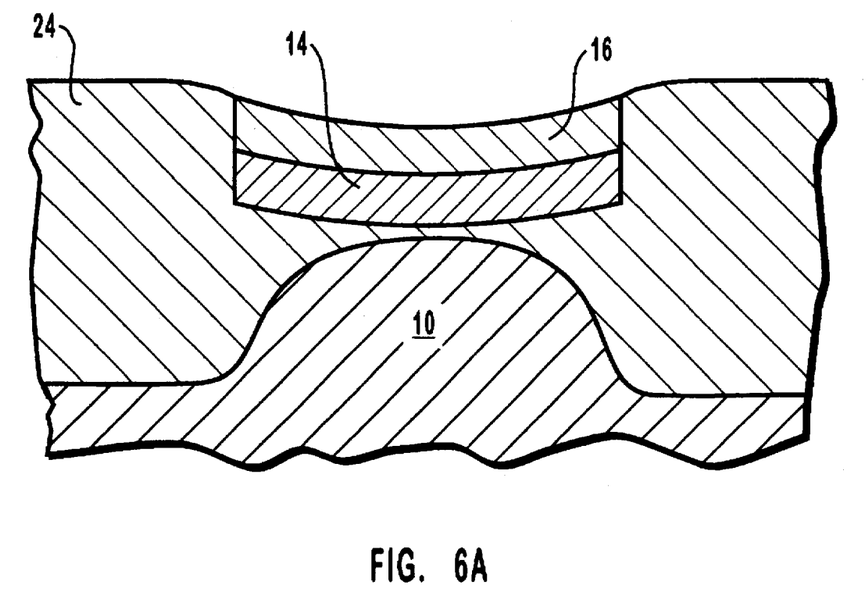
FIGS. 6A, 6B are, respectively, cross sections of FIGS. 5A, 5B after a second field oxidation.
Figure 6B:
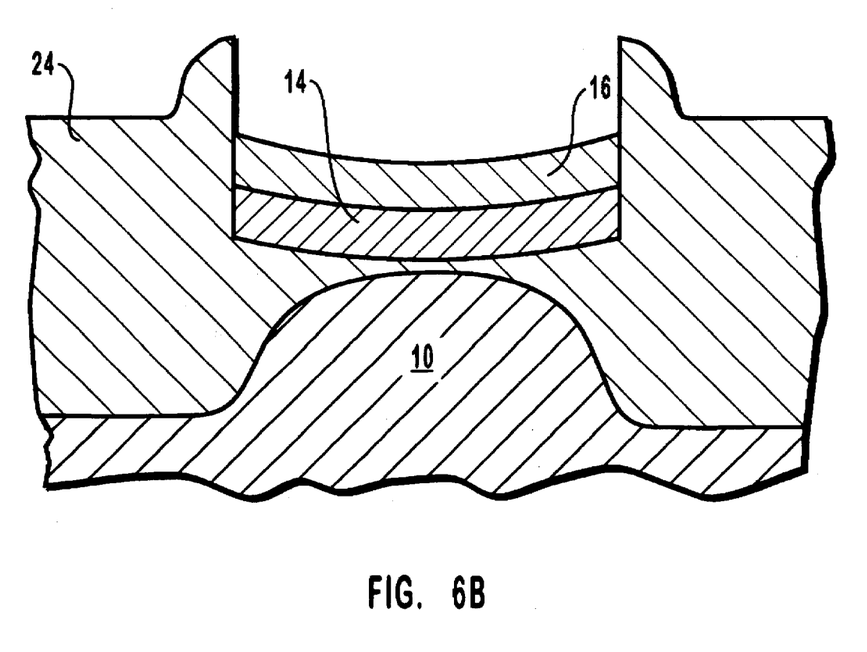

The results of second field oxidation Step 6 are shown in FIGS. 6A and 6B. FIG. 6A shows the cross section of FIG. 5A after a second field oxidation in Step 6. First nitride layer 14, and with it second oxide layer 16, have been deflected upward at the edges thereof, and field oxide 24 has grown a bird's beak formation into the area of first oxide layer 12, which layer is shown as having merged with field oxide 24. Similar results are shown in FIG. 6B, which shows the cross section of FIG. 5B after a second field oxidation in Step 6. Polysilicon spacers 22 have been completely oxidized and merged into field oxide 24, and moderate bird's beak formation has occurred.

A controlled moderate degree of bird's beak formation as provided by the inventive process is desirable to improve the shape of the field oxide/active area interface. About 600 Angstroms of controlled liftoff at the edges of the LOCOS stacks is desirable.

Figure 7A:
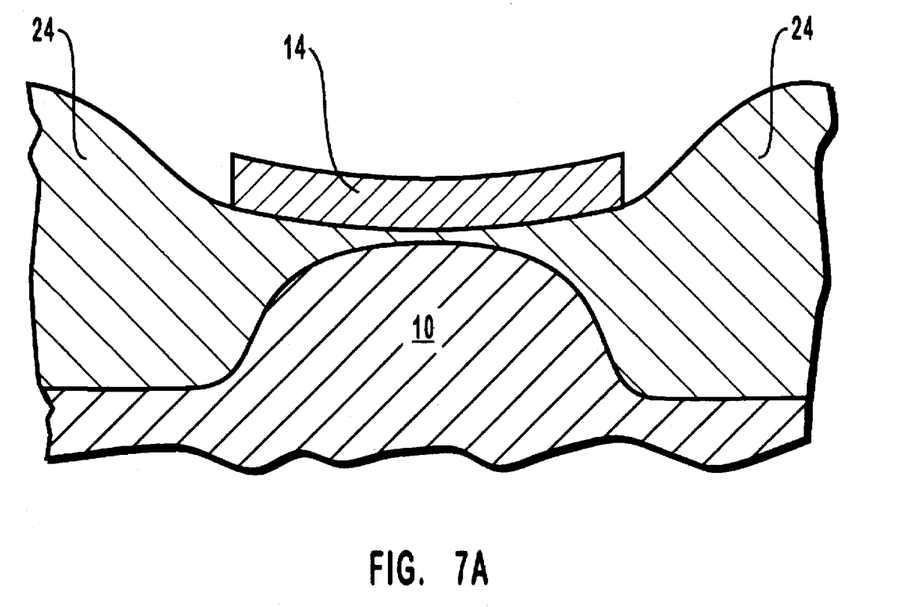
FIG. 7A, 7B are, respectively, cross sections of FIGS. 6A, 6B after removal of the second oxide layer.

After the second field oxidation of Step 6, a second oxide strip, as shown in Step 7A of FIG. 1, is performed to remove second oxide layer 16. HF strip or other conventional processes may be used in Step 7. The results of Step 7 are shown in FIG. 7A, which is the cross section of FIG. 6A after removal of second oxide layer 16, and in FIG. 7B, which is the cross section of FIG. 6B likewise after removal of second oxide layer 16.

Figure 7B:
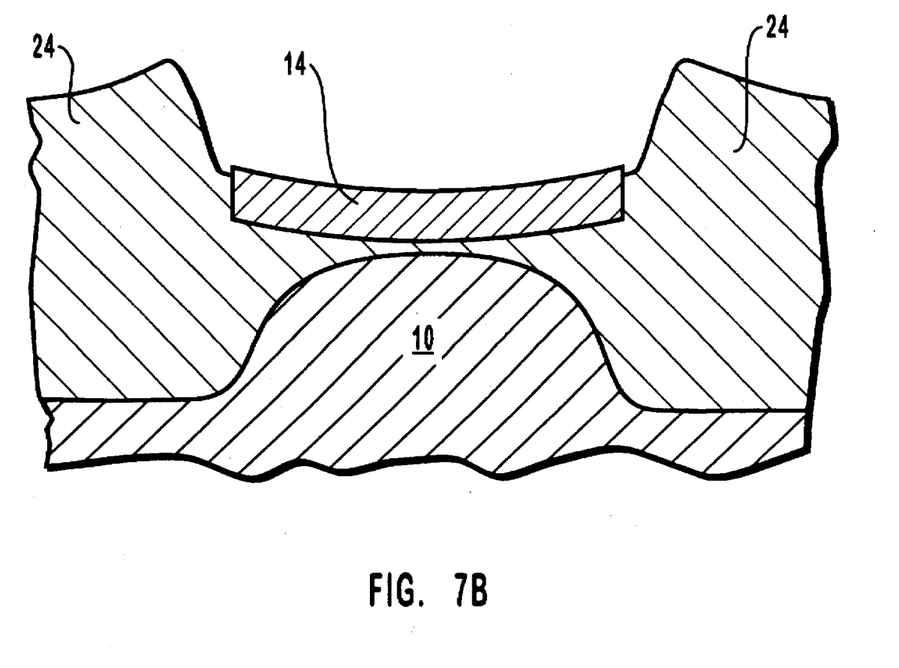
Figure 8A:
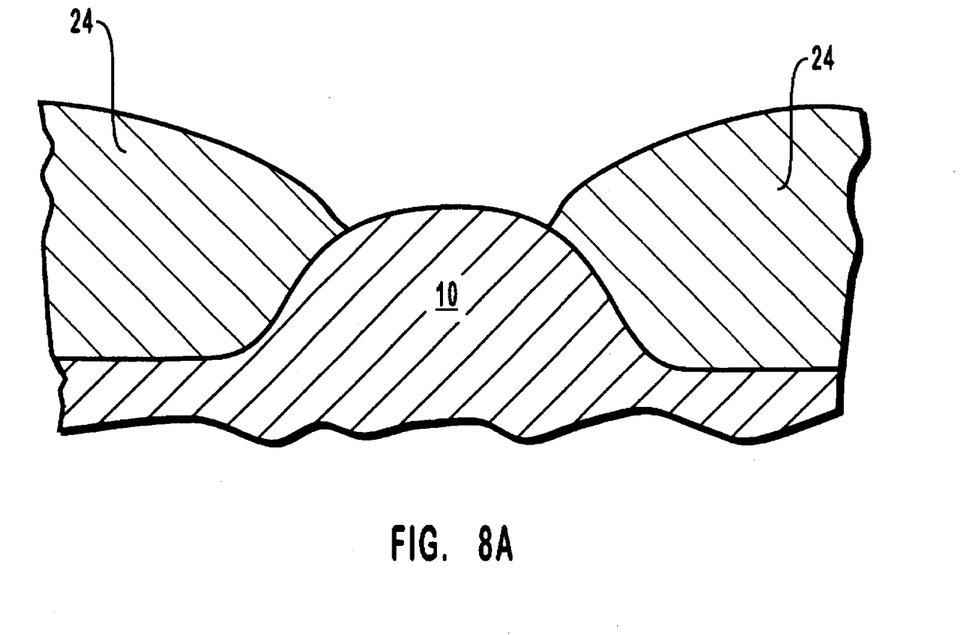
FIGS. 8A, 8B are, respectively, cross sections of FIGS. 7A, 7B after removal of the first nitride layer, pad oxide etch, and sacrificial gate oxide growth and removal.
Figure 8B:
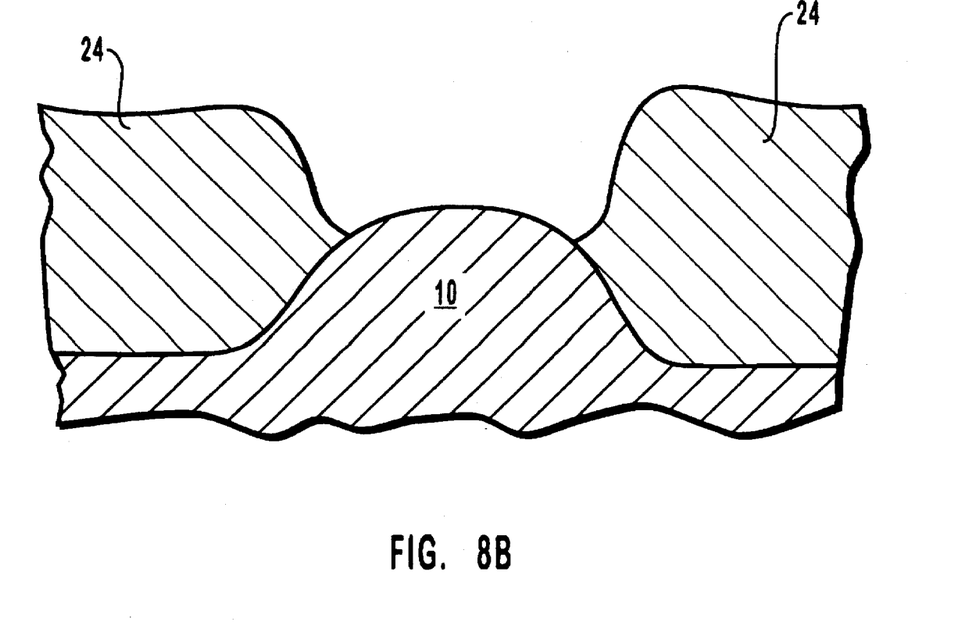

After second oxide layer 16 is removed, as shown in Step 7 of FIG. 1, first nitride layer 14 is stripped, as shown in Step 8 of FIG. 1. Hot phosphoric acid stripping or other conventional processes may be used in Step 8. Then, first thin oxide layer or pad oxide 12 is etched away during the pad oxide etch Step 9. Finally, a sacrificial gate oxide is grown and then removed in Step 10. The cross sections resulting from the performance of these steps upon the cross sections of FIGS. 7A and 7B are shown, respectively, in FIGS. 8A and 8B. The active area is now prepared for device formation by further processing.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for forming field oxide regions on a semiconductor substrate comprising the steps of:

producing a first oxide layer upon the semiconductor substrate;

depositing a first nitride layer upon the first oxide layer;

depositing a second oxide layer upon the first nitride layer;

depositing a second nitride layer upon the second oxide layer;

exposing selected portions of the semiconductor substrate by removing portions of the second nitride layer, the second oxide layer, the first nitride layer, and the first oxide layer over the selected portions of the semiconductor substrate, leaving, over nonselected portions of the semiconductor substrate a plurality of stacks, each said stack comprising a remaining portion of the first oxide layer, the first nitride layer, the second oxide layer, and the second nitride layer;

performing a first oxidation step of the selected portions of the semiconductor substrate to form a field oxide threat having a first thickness;

removing substantially all remaining portions of the second nitride layer of each said stack; and performing a second oxidation step to the selected portions of the semiconductor substrate to thicken the field oxide at the selected portions of the semiconductor substrate from the first thickness to a second thickness.

2. The process of claim 1, wherein, prior to said first oxidation step, the first oxide layer has a thickness in the range of about 50 to 150 Angstroms, the first nitride layer has a thickness in the range of about 1000–1500 Angstroms, the second oxide layer has a thickness in the range of about 200–500 Angstroms, and the second nitride layer has a thickness in the range of about 1500–2500 Angstroms.

3. The process of claim 1, wherein said field oxide formed in said first oxidation step is in contact with said second oxide layer, whereby the first thickness of the field oxide is sufficiently low to avoid defect formation during the first oxidation.

4. The process of claim 1 further including the step of laterally enclosing each stack of said plurality of stacks in polysilicon spacers.

5. The process of claim 4, wherein the second nitride layer of each said stack is in contact one of said polysilicon spacers after said step of laterally enclosing each stack of said plurality of stacks in polysilicon spacers.

6. The process of claim 4, wherein said field oxide formed in said first oxidation step is in contact with said second nitride layer, whereby the first thickness of the field oxide is sufficiently low to avoid defect formation during the first oxidation.

7. The process of claim 5, wherein each said polysilicon spacer is substantially converted to field oxide to form a portion of said field oxide formed in said second oxidation step.

8. The process of claim 6, wherein each said polysilicon spacer is physically isolated from said second nitride layer after said first oxidation step.

9. The process as defined in claim 1, wherein said first nitride layer and said second oxide layer are concave after said second oxidation step, and wherein said first oxide layer is substantially converted to field oxide to form a portion of said field oxide formed in said second oxidation step.

10. The process of claim 1, wherein at least one of the first and second nitride layers is substantially composed of silicon nitride.

11. The method of claim 1, wherein at least one of said first and second oxide layers is substantially composed of silicon dioxide.

12. A process for forming field oxide regions on a semiconductor substrate comprising the steps of:

producing a first oxide layer upon the semiconductor substrate;

depositing a first nitride layer upon the first oxide layer;

depositing a second oxide layer upon the first nitride layer;

depositing a second nitride layer upon the second oxide layer;

exposing selected portions of the semiconductor substrate by removing portions of the second nitride layer, the second oxide layer, the first nitride layer, and the first oxide layer over the selected portions of the semiconductor substrate, leaving, over nonselected portions of the semiconductor substrate a plurality of stacks, each said stack comprising a remaining portion of the first oxide layer, the first nitride layer, the second oxide layer, and the second nitride layer;

depositing a layer of polysilicon over each stack on said substrate;

anisotropically etching said polysilicon layer to form polysilicon spacers on each said stack with the second nitride layer of each said stack being in contact with one of said polysilicon spacers;

performing a first oxidation step of the selected portions of the semiconductor substrate to form a field oxide threat having a first thickness, said field oxide being in contact with said second oxide layer of substantially each said stack, each said polysilicon spacer being physically isolated from said second nitride layer after said first oxidation step;

removing substantially all remaining portions of the second nitride layer of each said stack; and performing a second oxidation step of the selected portions of the semiconductor substrate to thicken the field oxide at the selected portions of the semiconductor substrate from the first thickness to a second thickness, each said polysilicon spacer being substantially convened to field oxide to form a portion of said field oxide formed in said second oxidation step.

13. The process as defined in claim 12, wherein said first nitride layer and said second oxide layer are concave after said second oxidation step, and wherein said first oxide layer is substantially converted to field oxide to form a portion of said field oxide formed in said second oxidation step.

14. The process of claim 12, wherein at least one of the first and second nitride layers is substantially composed of silicon nitride.

15. The method of claim 12, wherein at least one of said first and second oxide layers is substantially composed of silicon dioxide.

16. The process of claim 12, prior to said first oxidation step, wherein the first oxide layer has a thickness in the range of about 50 to 150 Angstroms, the first nitride layer has a thickness in the range of about 1000–1500 Angstroms, the second oxide layer has a thickness in the range of about 200–500 Angstroms, and the second nitride layer has a thickness in the range of about 1500–2500 Angstroms.

17. A process for forming field oxide regions on a semiconductor substrate comprising the steps of:

producing a first oxide layer upon the semiconductor substrate;

depositing a first nitride layer upon the first oxide layer;

depositing a second oxide layer upon the first nitride layer;

depositing a second nitride layer upon the second oxide layer;

exposing selected portions of the semiconductor substrate by removing portions of the second nitride layer, the second oxide layer, the first nitride layer, and the first oxide layer over the selected portions of the semiconductor substrate, leaving, over nonselected portions of the semiconductor substrate a plurality of stacks, each laid stack comprising a remaining portion of the first oxide layer, the first nitride layer, the second oxide layer, and the second nitride layer;

performing a first oxidation step of the selected portions of the semiconductor substrate to form a field oxide threat having a first thickness, wherein said field oxide formed in said first oxidation step is in contact with said second oxide layer, and wherein the first nitfide layer is physically encapsulated by said field oxide and said second oxide layer;

removing substantially all remaining portions of the second nitride layer of each said stack;

performing a second oxidation step to the selected portions of the semiconductor substrate to increase the thickness of the field oxide at the selected portions of the semiconductor substrate from the first thickness to a second thickness, said first nitride layer and said second oxide layer being concave after said second oxidation step, and wherein said first oxide layer is substantially converted to field oxide to form a portion of said field oxide formed in said second oxidation step.

18. The process of claim 17 wherein the first oxide layer has a thickness in the range of about 50 to 150 Angstroms, the first nitride layer has a thickness in the range of about 1000–1500 Angstroms, the second oxide layer has a thickness in the range of about 200–500 Angstroms, and the second nitride layer has a thickness in the range of about 1500–2500 Angstroms.

19. The process of claim 17, wherein the semiconductor substrate is a silicon substrate.

* * * * *

UNITED STATES PATENT AND TRADEMARK OFFICE
CERTIFICATE OF CORRECTION

PATENT NO. : 5,679,600
DATED : Oct. 21, 1997
INVENTOR(S) : Werner Juengling

It is certified that error appears in the above-identified patent and that said Letters Patent is hereby corrected as shown below:

Col. 4, line 10, after "about" change "1500" to --1500--

Col. 7, line 56, before "having" change "threat" to --thereat--

Col. 8, line 1, after "substantially" change "convened" to --converted--

Col. 8, line 36, before "stack" change "laid" to --said--

Col. 8, line 43, after "first" change "nitfide" to --nitride--

Signed and Sealed this

Twenty-sixth Day of January, 1999

Attest:

Attesting Officer

*Acting Commissioner of Patents and Trademarks*